US009137929B1

(12) United States Patent
Yang

(10) Patent No.: US 9,137,929 B1
(45) Date of Patent: Sep. 15, 2015

(54) CONNECTOR MODULE

(71) Applicant: ALL BEST PRECISION TECHNOLOGY CO., LTD., Taoyuan County (TW)

(72) Inventor: Haven Yang, New Taipei (TW)

(73) Assignee: ALL BEST PRECISION TECHNOLOGY CO., LTD., Taoyuan (TW)

(*) Notice: Subject to any disclaimer, the term of this patent is extended or adjusted under 35 U.S.C. 154(b) by 40 days.

(21) Appl. No.: 14/261,215

(22) Filed: Apr. 24, 2014

(51) Int. Cl.

| | |
|---|---|
| ***H01R 13/00*** | (2006.01) |
| ***H05K 7/20*** | (2006.01) |
| ***H01R 13/46*** | (2006.01) |
| ***H01R 12/50*** | (2011.01) |

(52) U.S. Cl.
CPC .............. *H05K 7/2039* (2013.01); *H01R 13/46* (2013.01); *H01R 23/7073* (2013.01)

(58) Field of Classification Search
CPC ... H05K 7/2039; H01R 13/46; H01R 23/7073
USPC ................................. 439/79, 485, 487, 541.5
See application file for complete search history.

(56) References Cited

U.S. PATENT DOCUMENTS

| | | | | |
|---|---|---|---|---|
| 8,678,862 B2 * | 3/2014 | Peng et al. | ..................... | 439/638 |
| 8,702,445 B2 * | 4/2014 | Yu et al. | ......................... | 439/485 |
| 8,926,360 B2 * | 1/2015 | Manahan et al. | ............. | 439/485 |
| 9,022,800 B2 * | 5/2015 | Yang et al. | ..................... | 439/487 |
| 2015/0171545 A1 * | 6/2015 | Yu et al. | ......................... | 439/485 |

* cited by examiner

*Primary Examiner* — Khiem Nguyen
(74) *Attorney, Agent, or Firm* — WPAT, P.C.; Anthony King

(57) ABSTRACT

A connector module includes a connector module main body having a base and a case, and a heat-dissipation element. The base has an external connection surface and two top-and-bottom spaced slots located above the external connection surface. The case internally defines an upper and a lower slot way separated from each other by a supporting rack, which has a bottom opening. The base is fitted in the case with the external connection surface downward exposed from the case and the two slots communicating with the upper and lower slot ways. The heat-dissipation element is mounted in the connector module main body in a front-rear direction with a heat-absorbing surface located corresponding to the bottom opening of the supporting rack and above the lower slot way for contacting with a plug device in the lower slot way to ensure good heat-dissipation efficiency and data transmission rate of the connector module.

8 Claims, 16 Drawing Sheets

CONNECTOR MODULE

FIELD OF THE INVENTION

The present invention relates to a connector module, and more particularly, to a connector module that has improved heat-dissipation efficiency and data transmission rate.

BACKGROUND OF THE INVENTION

Presently, various kinds of electronic apparatuses are constantly developed, and these electronic apparatuses all need connector modules to enable data transmission among them. However, most of the current connector modules have poor heat dissipation efficiency to adversely affect the data transmission rate because the heat produced by the connector modules during operation thereof is dissipated only by convection. Therefore, it is tried by the inventor to develop a connector module that has improved heat dissipation efficiency to ensure good data transmission rate.

SUMMARY OF THE INVENTION

To overcome the drawbacks of the conventional connector modules, it is a primary object of the present invention to provide a new connector module that has improved heat dissipation efficiency and data transmission rate.

To achieve the above and other objects, the connector module according to the present invention includes a connector module main body and a heat-dissipation element. The connector module main body includes a base and a case. The base has an external connection surface formed at a bottom thereof and two top-and-bottom spaced slots located above the external connection surface. The case has a front portion internally formed into an upper and a lower slot way that are separated from each other by a supporting rack mounted in the case between the two slot ways, and the supporting rack has a bottom opening. The base is fitted in the case, such that the external connection surface is downward exposed from the case and the two slots are located corresponding to and communicable with the upper and lower slot ways. The heat-dissipation element has a heat-absorbing surface and is mounted in the connector module main body in a front-rear direction, such that the heat-absorbing surface is located corresponding to the bottom opening of the supporting rack and above a top inner wall surface of the lower slot way in the case for directly contacting with a plug device that is plugged into the lower slot way.

In an embodiment of the present invention, the heat-dissipation element includes three sequentially arranged sections, namely, a heat-absorption section, a heat-transfer section and a heat-dissipation section. The heat-absorbing surface is located on a bottom of the heat-absorption section; and the heat-transfer section is extended through a space between the two top-and-bottom spaced slots of the base and through the case, such that the heat-dissipation section is exposed from the case.

In the above embodiment of the present invention, the heat-absorption section is U-shaped and the heat-transfer section and the heat-dissipation section are respectively flat in shape. The heat-transfer section is extended from one lateral side of the heat-absorption section and is sidewardly bent behind the base to form the heat-dissipation section.

In the above embodiment of the present invention, the heat-absorption section can be formed with at least one downward protruded portion, and the heat-absorbing surface is located on the protruded portion.

In the above embodiment of the present invention, the heat-dissipation element may further include at least one radiation fin provided on one or both of a top of the heat-absorption section and the heat-dissipation section; and the heat-dissipation section can optionally have at least one graphite fin provided thereon.

In the above embodiment of the present invention, the base further includes at least one heat-dissipation passage formed between the two top-and-bottom spaced slots, and the case has a rear portion formed with at least one heat outlet. In another embodiment of the present invention, the heat-dissipation element includes a heat-absorption unit and a heat-dissipation unit located atop the heat-absorption unit. In the other embodiment, the heat-absorbing surface is located on a bottom of the heat-absorption unit, and both of the heat-absorption unit and the heat-dissipation unit are located in the supporting rack.

In the other embodiment of the present invention, the heat-absorption unit is a heat-absorbing sheet and the heat-dissipation unit is a radiation fin.

In the other embodiment of the present invention, the heat-absorption unit can be formed with at least one downward protruded portion, and the heat-absorbing surface is located on the protruded portion.

With the above arrangements, the connector module of the present invention can have improved heat dissipation efficiency to ensure good data transmission rate.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
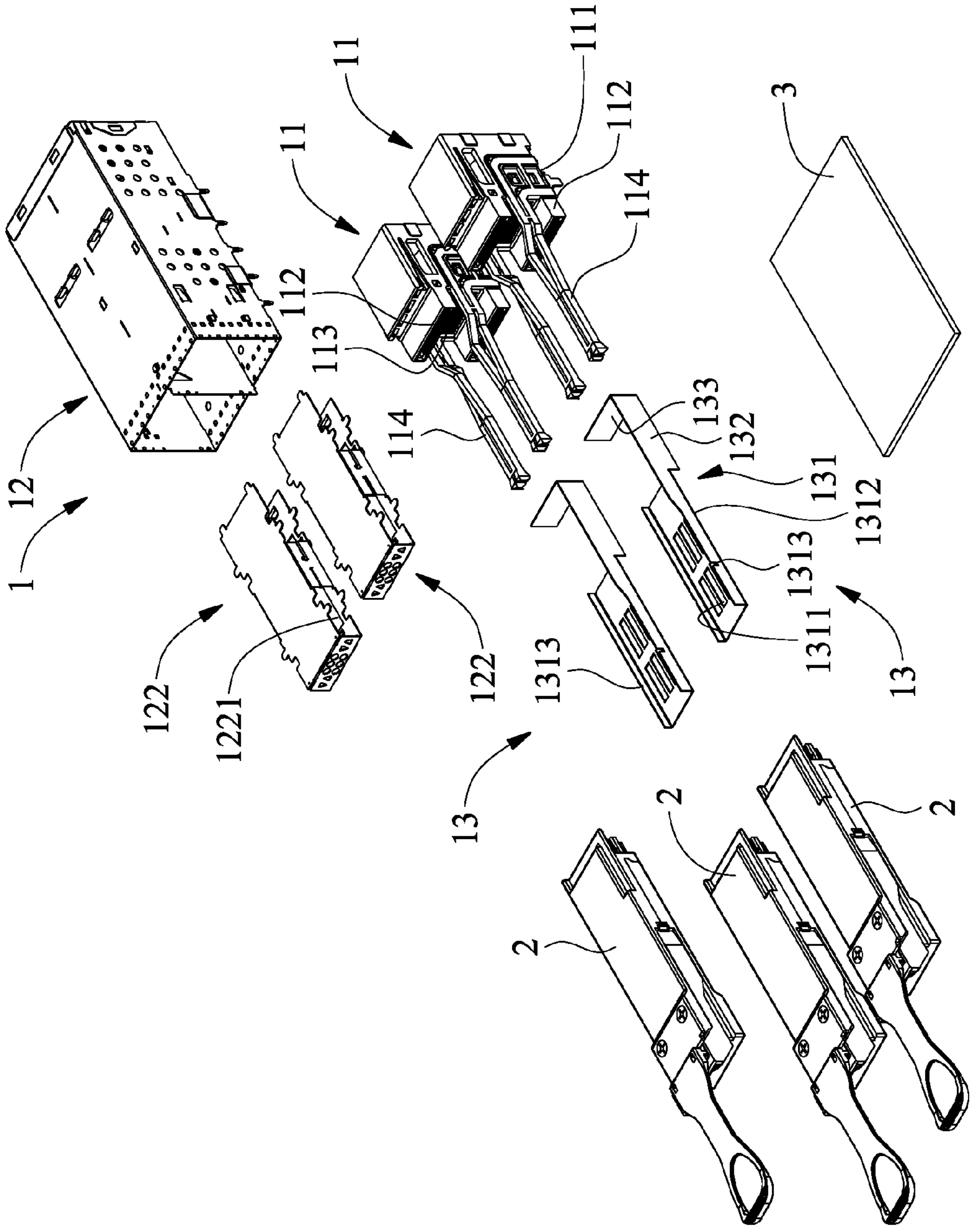
FIG. 1 is an exploded perspective view of a connector module according to a first embodiment of the present invention.

The present invention will now be described with some preferred embodiments thereof and with reference to the accompanying drawings. For the purpose of easy to understand, elements that are the same in the preferred embodiments are denoted by the same reference numerals.

Figure 2:
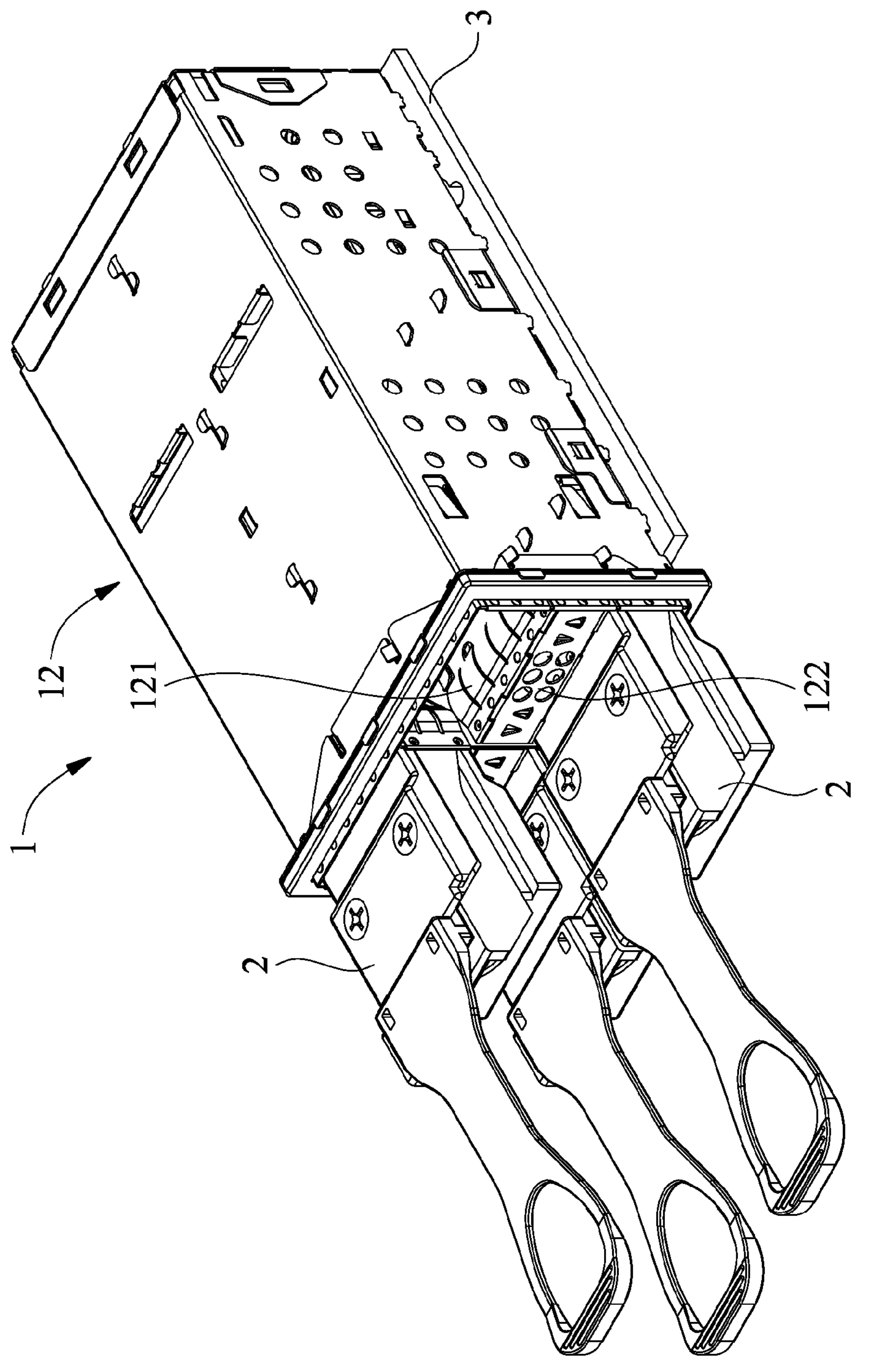
FIG. 2 is an assembled front perspective view of the connector module according to the first embodiment of the present invention.
Figure 3:
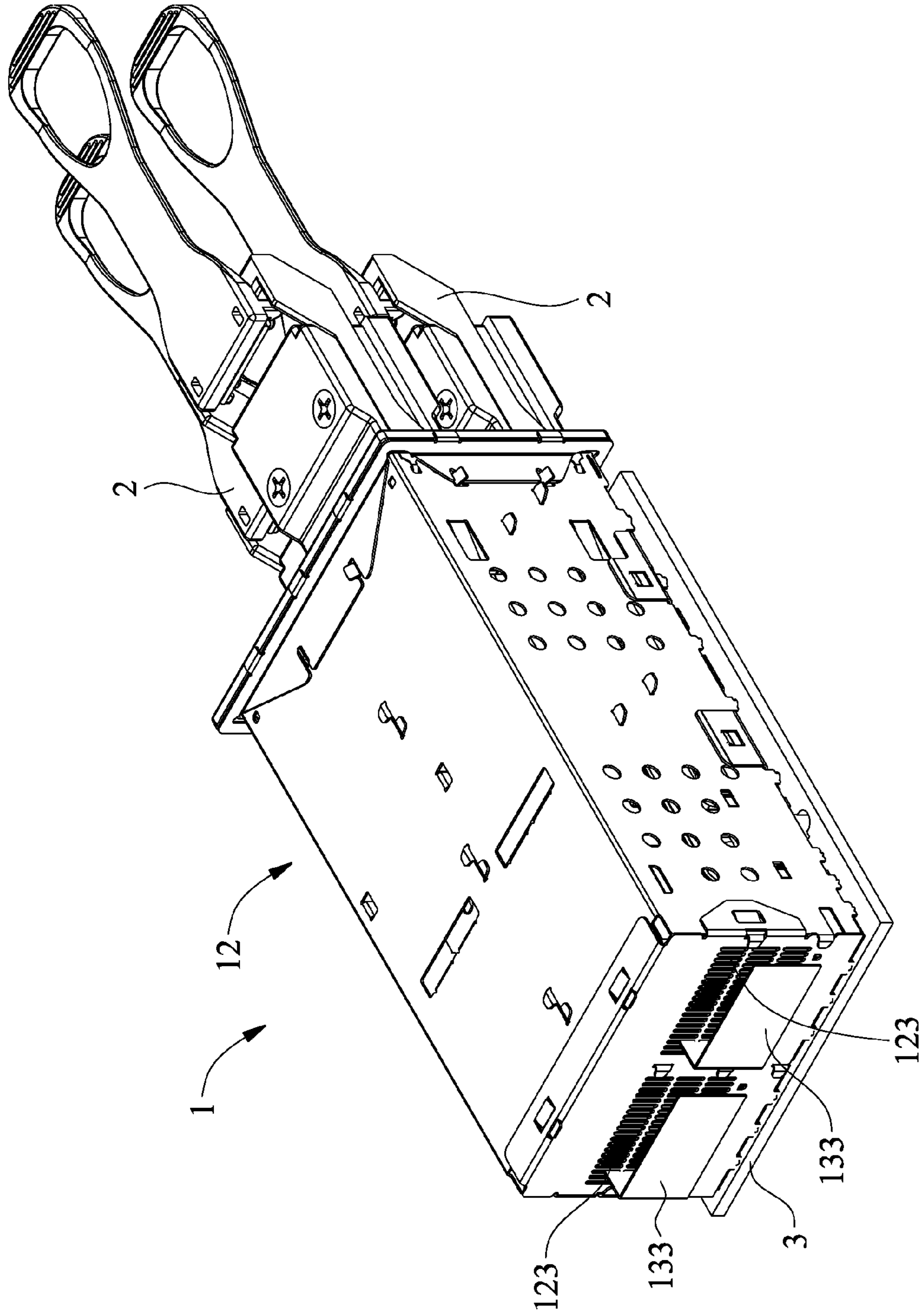
FIG. 3 is an assembled rear perspective view of the connector module according to the first embodiment of the present invention.
Figure 4:
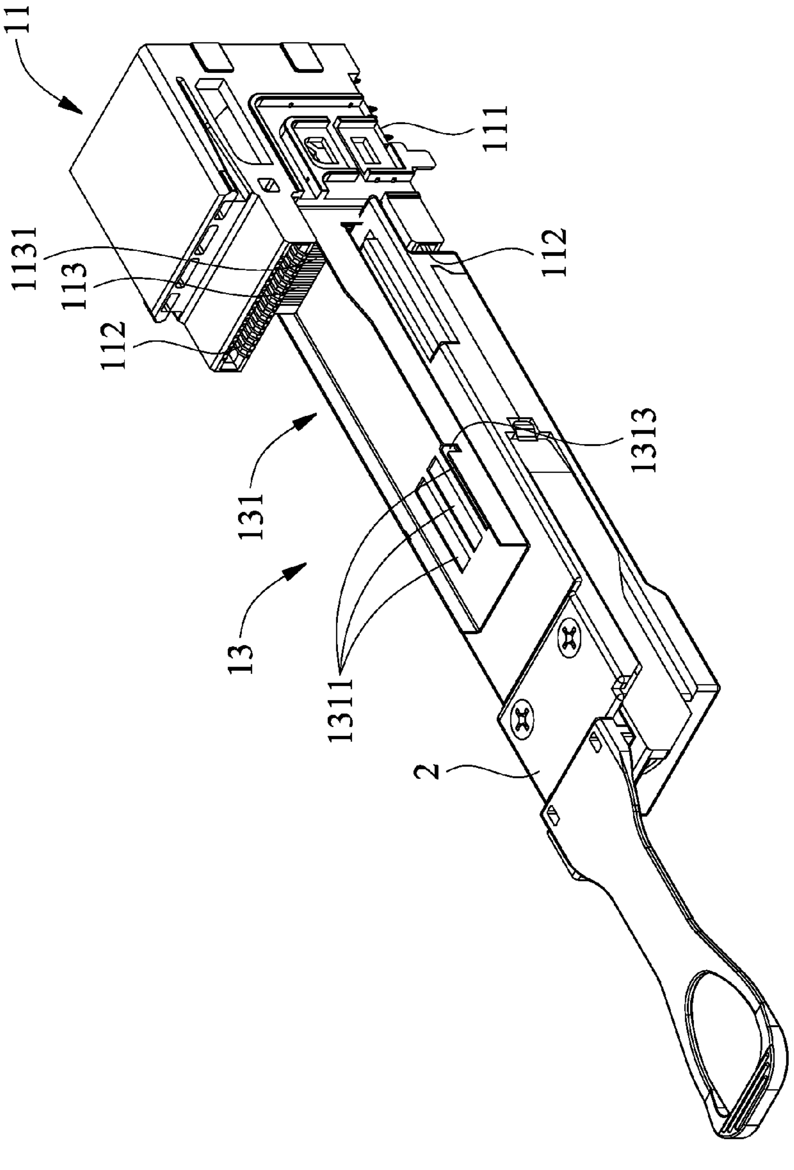
FIG. 4 is an assembled front perspective view of a heat-dissipation element, a base and a plug device included in the connector module according to the first embodiment of the present invention.
Figure 5:
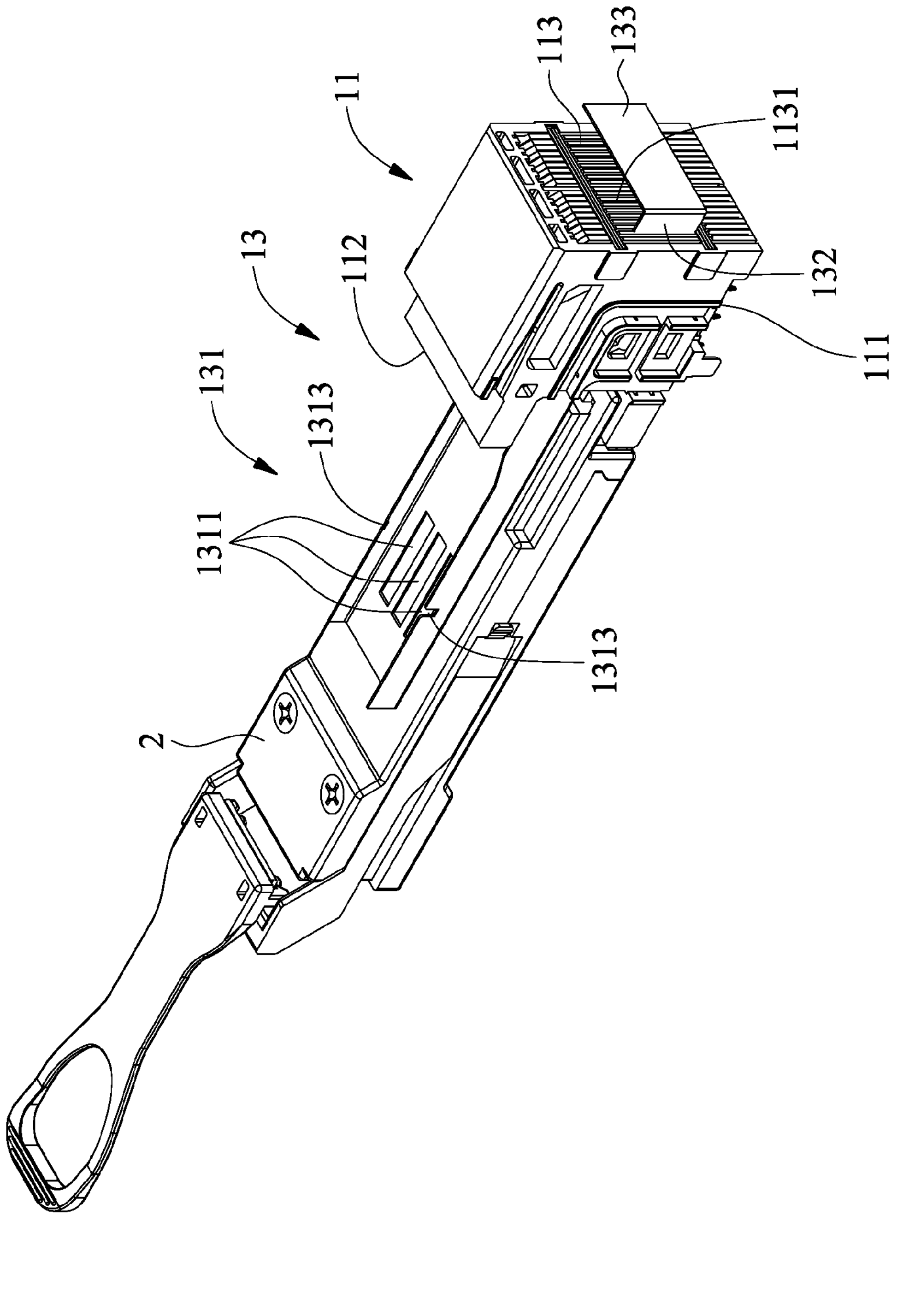
FIG. 5 is a rear view of FIG. 4.
Figure 6:
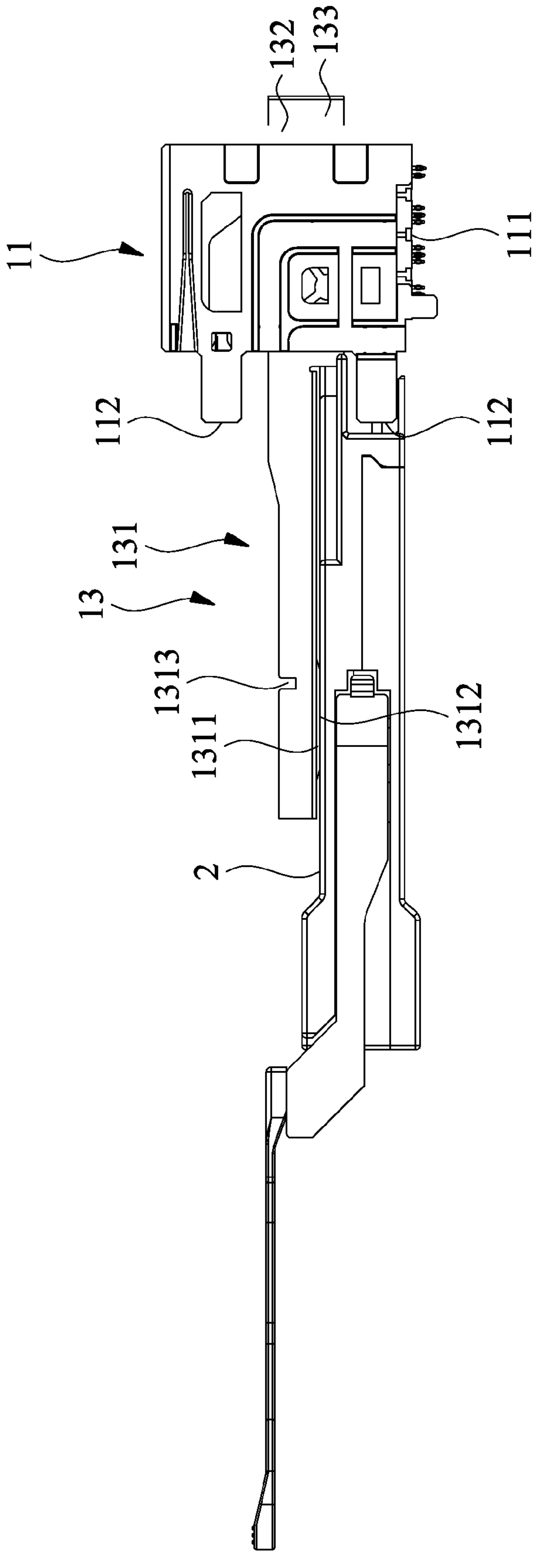
FIG. 6 is a side view of FIG. 5.

Please refer to FIGS. 1 to 3, wherein FIG. 1 is an exploded perspective view of a connector module according to a first embodiment of the present invention, and FIGS. 2 and 3 are assembled front and rear perspective views of FIG. 1, respectively. As shown, the connector module according to the first embodiment of the present invention includes a connector module main body 1 and a heat-dissipation element 13. In FIGS. 1 to 3, two connector module main bodies 1 and two heat-dissipation elements 13 are illustrated. Every connector module main body 1 includes a base 11 and a case 12. The base 11 has an external connection surface 111 formed at a bottom thereof for electrically connecting to a circuit board 3, two top-and-bottom spaced slots 112 located above the external connection surface 111 for electrically connecting with a plug device 2 each, a plurality of laterally spaced terminal carriers 113 located between the two slots 112 for carrying a plurality of conducting terminals (not shown) provided in the slots 112, and two sets of light-guide bars 114 located at two opposite lateral sides of the base 11. At least one heat-dissipation passage 1131 is formed between two adjacent terminal carriers 113. The case 12 has a front portion internally formed into an upper and a lower slot way 121, which are separated from each other by a supporting rack 122 mounted in the case 12 between the two slot ways 121; and a rear portion provided with at least one heat outlet 123. In case of having two or more heat outlets 123, they are laterally spaced. The base 11 is fitted in the case 12 with the external connection surface 111 downward exposed from the case 12 for electrically connecting to the circuit board 3. The upper and lower slot ways 121 are located corresponding to and communicable with the two top-and-bottom spaced slots 112, such that the plug devices 2 can be extended through the slot ways 121 into the slots 112 of the base 11 in a front-rear direction to electrically connect thereto, and the light-guide bars 114 can indicate a data transmission state of the plug devices 2. The supporting rack 122 helps in supporting and holding the light-guide bars 114 in place, and can be a lying U-shaped member with an opening 1221 formed on a bottom thereof. The lying U-shaped supporting rack 122 can be fixed at two lateral sides to two lateral inner wall surfaces of the case 12 with a rear open side of the supporting rack 122 fixed to a front side of the base 11, so as to divide an interior of the case 12 into the upper and lower slot ways 121. The heat outlet 123 is communicable with the heat-dissipation passages 1131 respectively formed between any two adjacent terminal carriers 113, so that waste heat produced by the connector module main body 1 and the plug devices 2 can pass through the heat-dissipation passages 1131 and the heat outlet 123 to dissipate into an external environment. Please also refer to FIGS. 4, 5 and 6 that are front perspective view, rear perspective view and side view, respectively, of the heat-dissipation element 13, the base 11 and one plug device 2 in an assembled state. The heat-dissipation element 13 has a heat-absorbing surface 1312 and is mounted in the connector module main body 1 in a front-rear direction to extend in the same direction as the plug devices 2 plugging into or pulling out of the slot way 121, such that the heat-absorbing surface 1312 is located corresponding to the bottom opening 1221 of the supporting rack 122 and above a top inner wall surface of the lower slot way 121 in the case 12. That is, the heat-dissipation element 13 is in direct contact with a top outer surface of the plug device 2 that is plugged in the lower slot way 121. For the purpose of clarity, the plug device 2 that is plugged in the lower slot way 121 is also referred to as the lower plug device 2 herein. The two slot ways 121 have inner wall surfaces that are facing toward outer surfaces of the plug devices 2. The supporting rack 122 also functions to assist in holding or to fully hold the heat-dissipation element 13 in place. It is understood the connector module main body 1 with the above described structure is only illustrative. In other operable embodiments thereof, the heat-dissipation passages 1131, the heat outlet 123, the terminal carriers 113 or the light-guide bars 114 may be optionally omitted from the connector module main body 1. In the illustrated first embodiment, the heat-absorbing surface 1312 of the heat-absorbing element 13 is located at a position corresponding to the top inner wall surface of the lower slot way 121 in the case 12 to directly contact with the top outer surface of the lower plug device 2. However, the location of the heat-absorbing surface 1312 can be changed according to actual need. That is, the heat-absorbing surface 1312 can be located at a position corresponding to another inner wall surface of the lower slot way 121 to directly contact with another corresponding outer surface of the lower plug device 2.

According to the connector module in the first embodiment of the present invention, waste heat produced by the connector module main body 1 and the plug devices 2 can be transferred by the heat-dissipation element 13 to finally dissipate into an outer side of the connector module by way of convection. With these arrangements, both the connector module main body 1 and the plug devices 2 can have upgraded heat dissipation efficiency and data transmission rate. In the case the connector module main body 1 includes both the heat-dissipation passages 1131 and the heat outlets 123, an even better heat dissipation effect can be obtained for the connector module main body 1 through heat transfer and convection.

Please refer to FIGS. 1 to 6. In the first embodiment of the connector module, the heat-dissipation element 13 includes three sequentially arranged sections, namely, a heat-absorption section 131, a heat-transfer section 132, and a heat-dissipation section 133. In an assembled state of the connector module, the heat-absorption section 131 is located in the lying U-shaped supporting rack 122, and the above-mentioned heat-absorbing surface 1312 is located on a bottom of the heat-absorption section 131 and corresponding to the bottom opening 1221 of the supporting rack 122; and the heat-transfer section 132 is extended into a space between the two top-and-bottom spaced upper and lower slots 112 to pass through and be clamped in one heat-dissipation passage 1131 formed between two adjacent terminal carriers 113, such that the heat-dissipation section 133 is exposed from the heat outlet 123. Since the heat-absorbing surface 1312 of the heat-absorption section 131 of the heat-dissipation element 13 is in direct contact with the top outer surface of the lower plug device 2, and since the heat-transfer section 132 of the heat-dissipation element 13 is in direct contact with the base 11 of the connector module main body 1, the waste heat produced by the connector module main body 1 and the lower plug device 2 can be absorbed by the heat-absorption section 131 and transferred by the heat-transfer section 132 to the heat-dissipation section 133, from where the waste heat is dissipated into ambient air due to convection. Therefore, with the heat-dissipation element 13, the connector module main body 1 and the plug device 2 can have increased heat dissipation efficiency and data transmission rate. In the illustrated first embodiment, the base 11 of the connector module main body 1 requires at least one heat-dissipation passage 1131 for routing and clamping the heat-transfer section 132 of the heat-dissipation element 13, and the case 12 requires at least one heat outlet 123 for the heat-dissipation section 133 to expose from the case 12. The connector module main body 1 in the first embodiment can ensure even better heat transfer and heat convection effects when it has a plurality of heat-dissipation passages 1131 and a plurality of heat outlets 123.

As can be seen in FIG. 1, in the connector module according to the first embodiment, the heat-absorption section 131 of the heat-dissipation element 13 is substantially U-shaped with a fixing notch 1313 formed on each of two lateral walls thereof for fixing the light-guide bars 114 thereto. And, the heat-transfer section 132 and the heat-dissipation section 133 of the heat-dissipation element 13 are respectively flat in shape. The heat-transfer section 132 is extended from one lateral side of the heat-absorption section 131 to pass through one heat-dissipation passage 1131 formed between two adjacent terminal carriers 113 and is sidewardly bent behind the heat-dissipation passage 1131 to form the heat-dissipation section 133. In the first embodiment, the heat-dissipation section 133 is located outside the heat outlet 123. Thus, the heat-dissipation element 13 according to the present invention can be integrally formed by cutting and bending a substantially L-shaped flat sheet.

Please refer to FIGS. 1 and 4 to 6. In the first embodiment of the present invention, the heat-absorption section 131 of the heat-dissipation element 13 can be stamped to form at least one downward protruded portion 1311. In this case, the heat-absorbing surface 1312 is located on the at least one protruded portion 1311. When the lower plug device 2 passes through the lower slot way 121, the heat-absorbing surface 1312 on the at least one protruded portion 1311 is in direct contact with part of the top outer surface of the lower plug device 2 to absorb the waste heat produced by the lower plug device 2.

Figure 7:
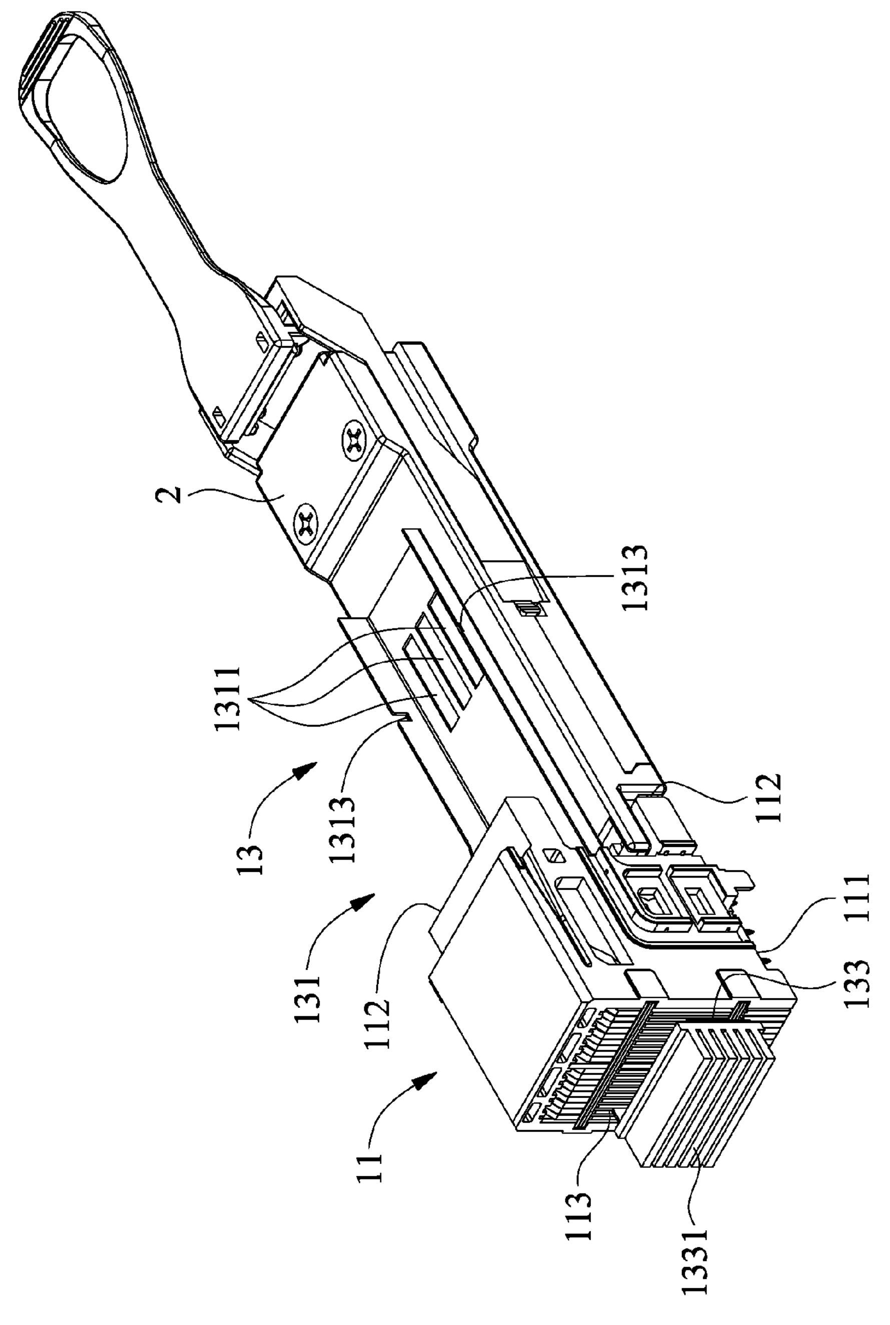
FIG. 7 is similar to FIG. 5 with the heat-dissipation element further including a plurality of radiation fins.

Please refer to FIG. 7 that is another rear perspective view of the heat-dissipation element 13, the base 11 and the lower plug device 2 in an assembled state. According to an operable embodiment of the present invention, the connector module can further include at least one radiation fin 1331 provided on one or both of a top of the heat-absorption section 131 and the heat-dissipation section 133. Or, at least one graphite fin can be provided on the heat-dissipation section 133. While the embodiment shown in FIG. 7 includes a plurality of radiation fins 1331 or graphite fins provided on the heat-dissipation section 133, it is understood the radiation fins 1331 or the graphite fins can be otherwise provided on the top of the heat-absorption section 131 or on both of the top of the heat-absorption section 131 and the heat-dissipation section 133 for the connector module main body 1 and the lower plug device 2 to have further increased heat dissipation efficiency and data transmission rate.

Figure 8:
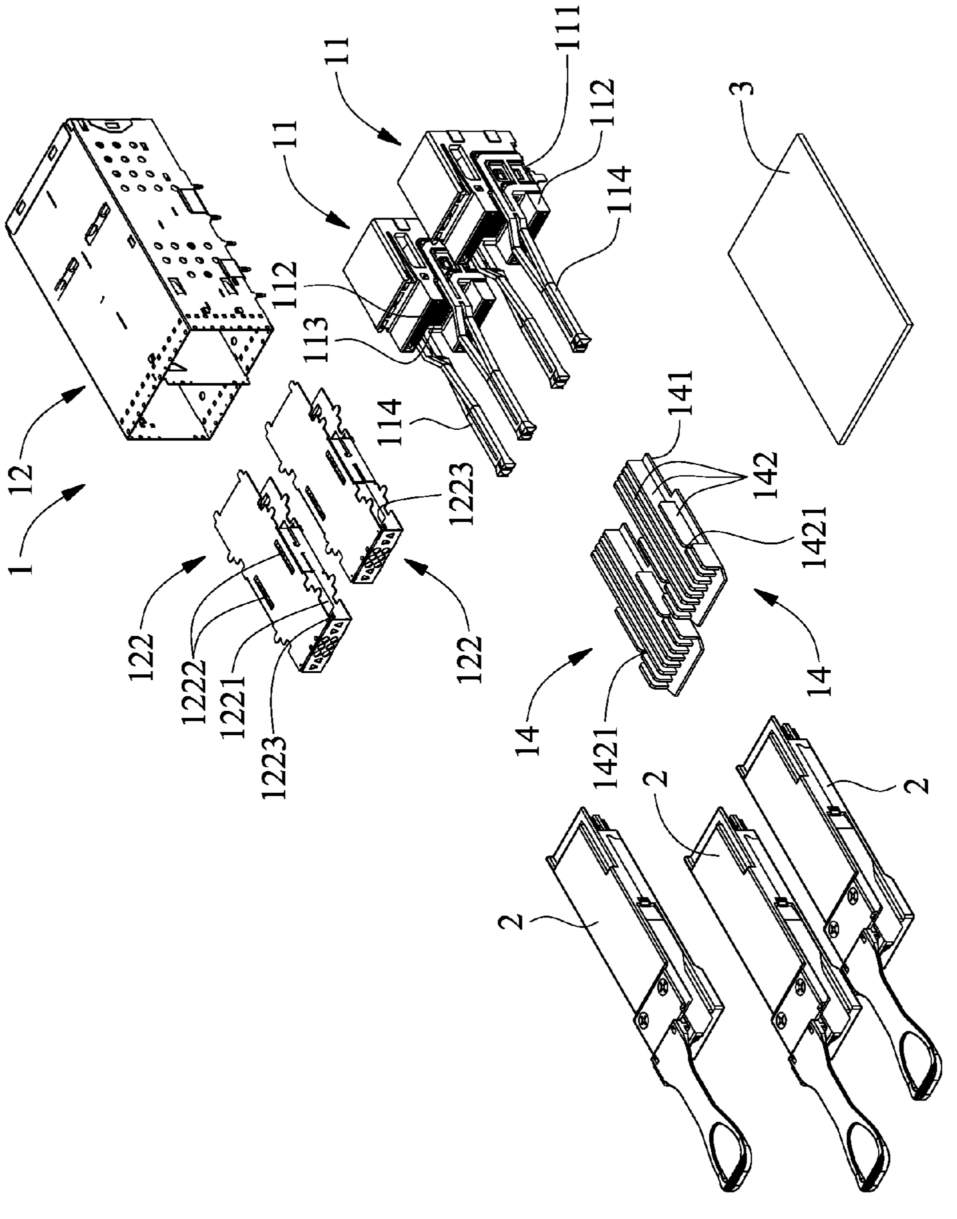
FIG. 8 is an exploded perspective view of a connector module according to a second embodiment of the present invention.
Figure 9:
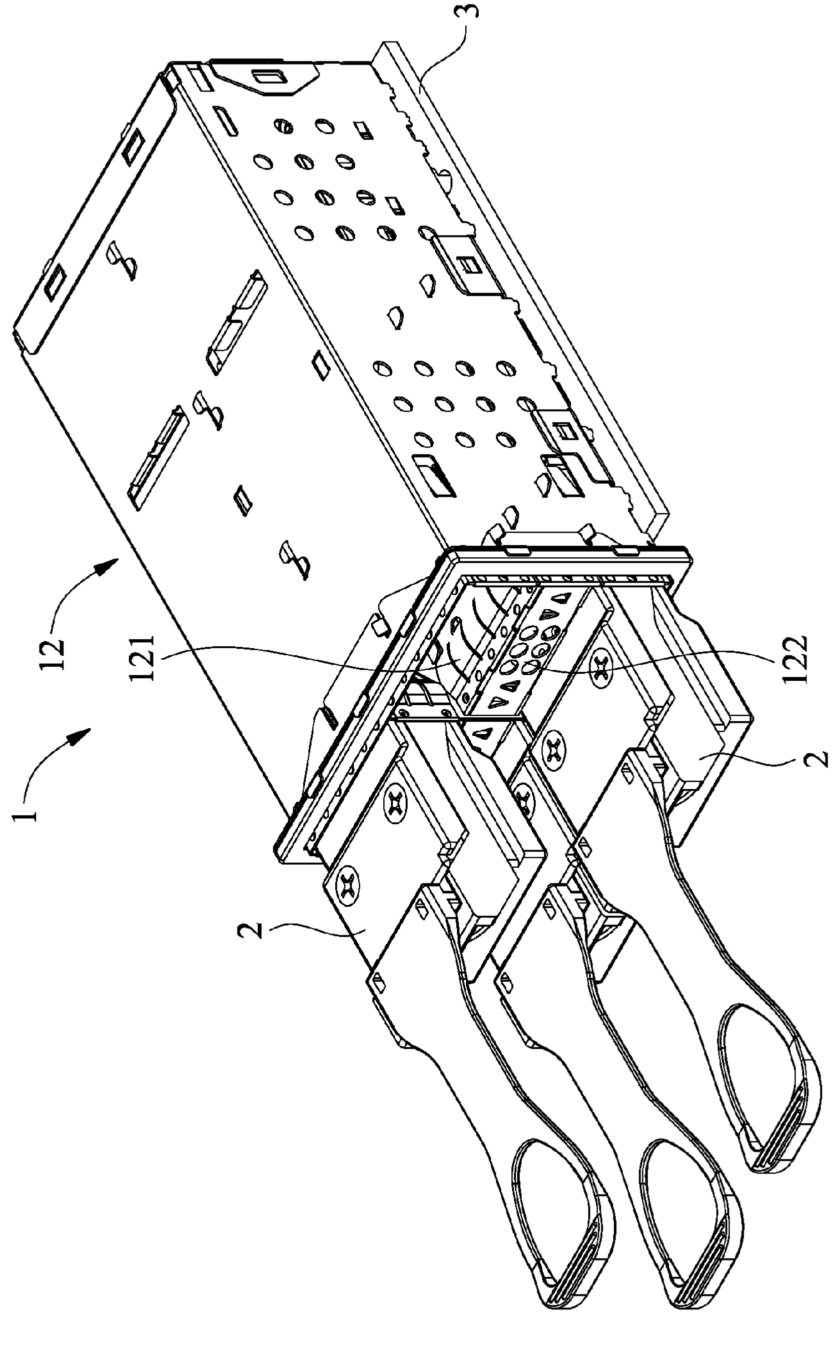
FIG. 9 is an assembled front perspective view of the connector module according to the second embodiment of the present invention.
Figure 10:
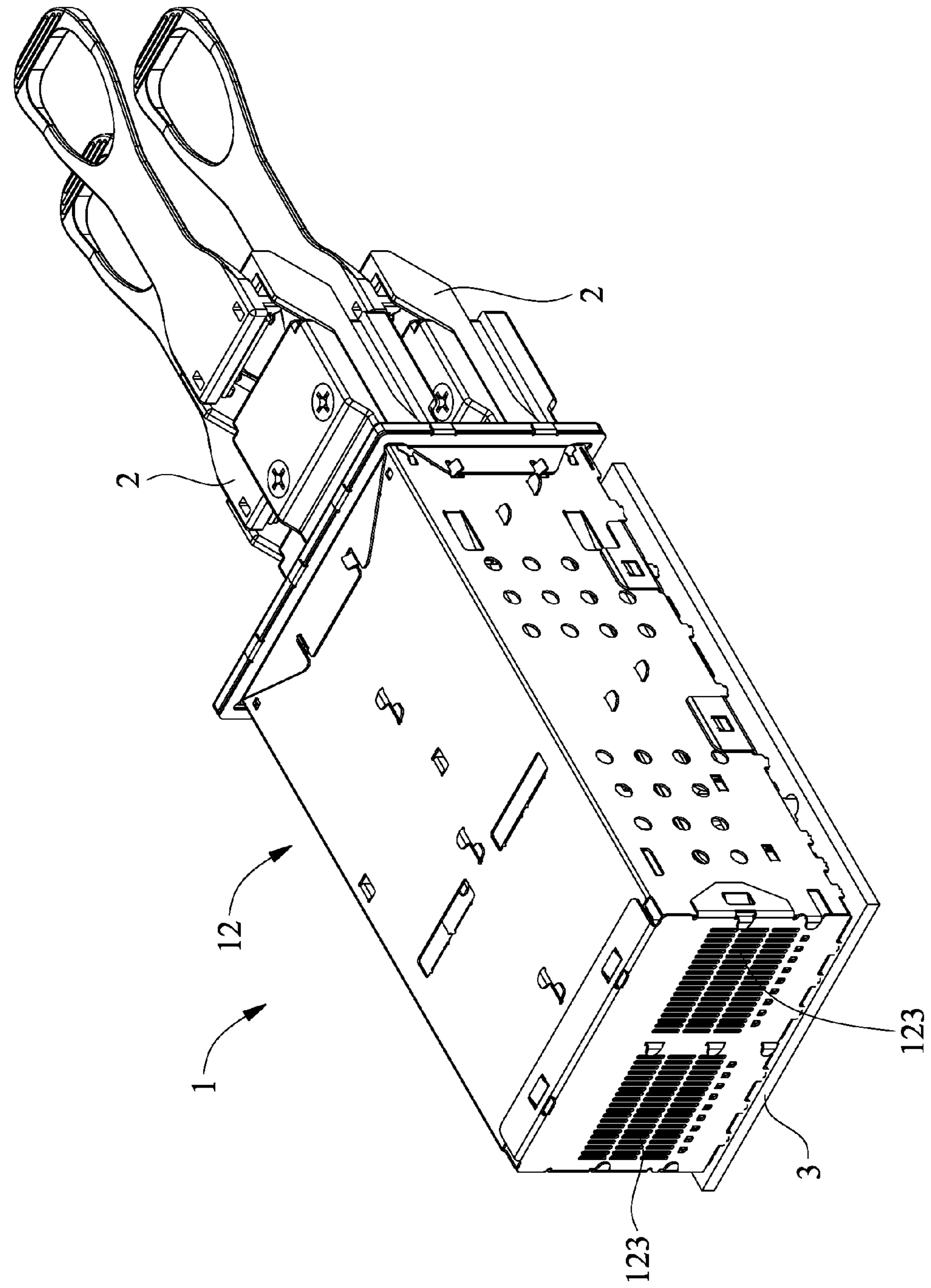
FIG. 10 is an assembled rear perspective view of the connector module according to the second embodiment of the present invention.
Figure 11:
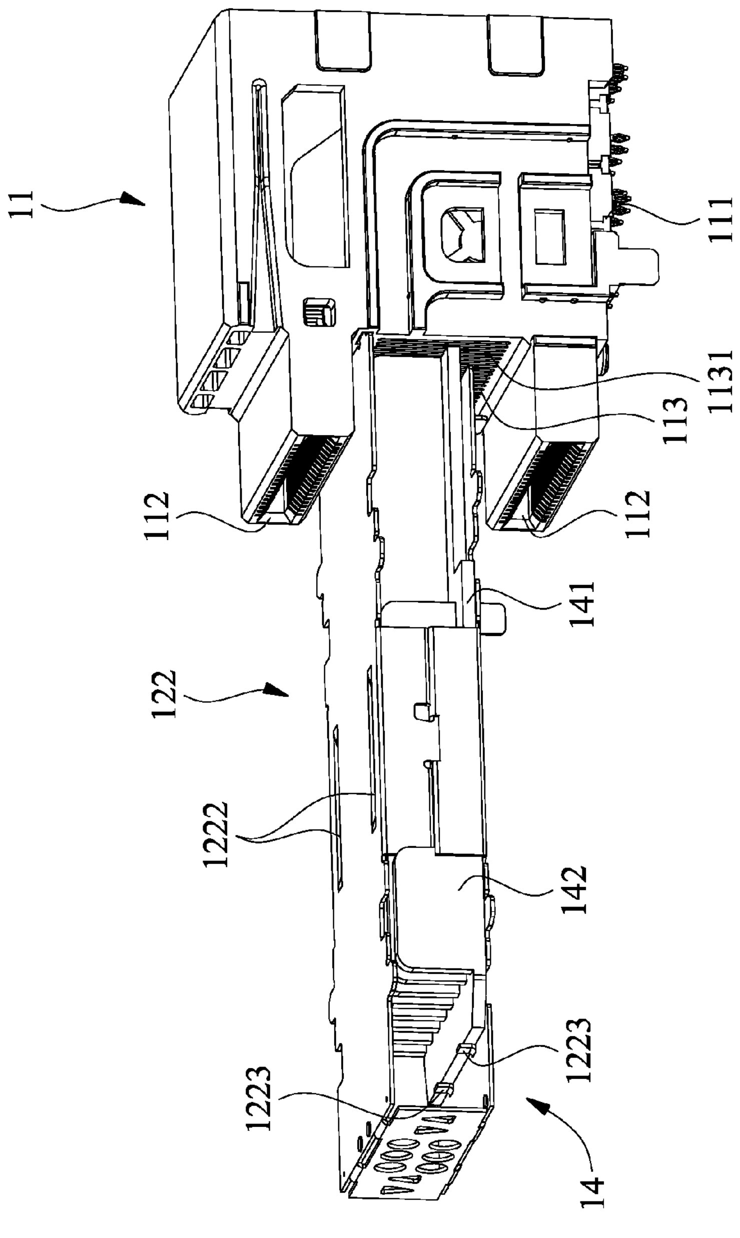
FIG. 11 is an assembled perspective view of a heat-dissipation element, a base and a supporting rack included in the connector module according to the second embodiment of the present invention.
Figure 12:
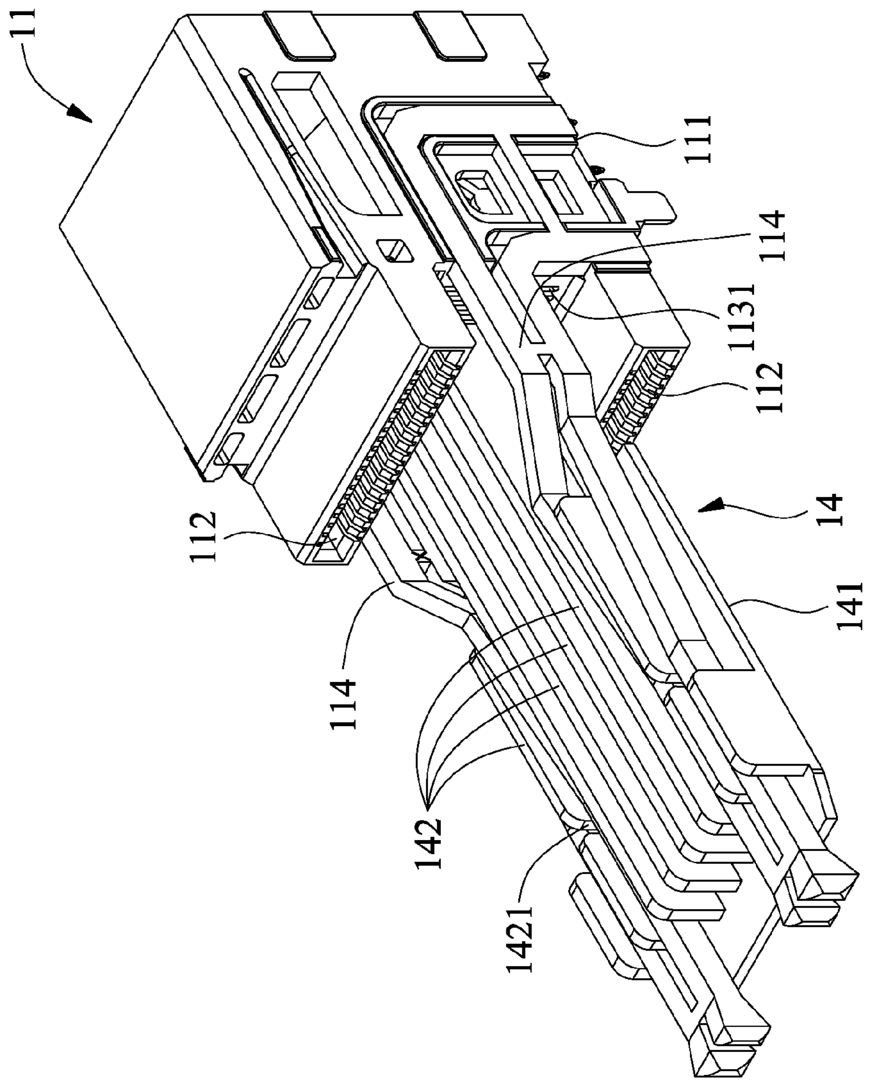
FIG. 12 is an assembled perspective view of a heat-dissipation element, a base and two sets of light-guide bars included in the connector module according to the second embodiment of the present invention.
Figure 13:
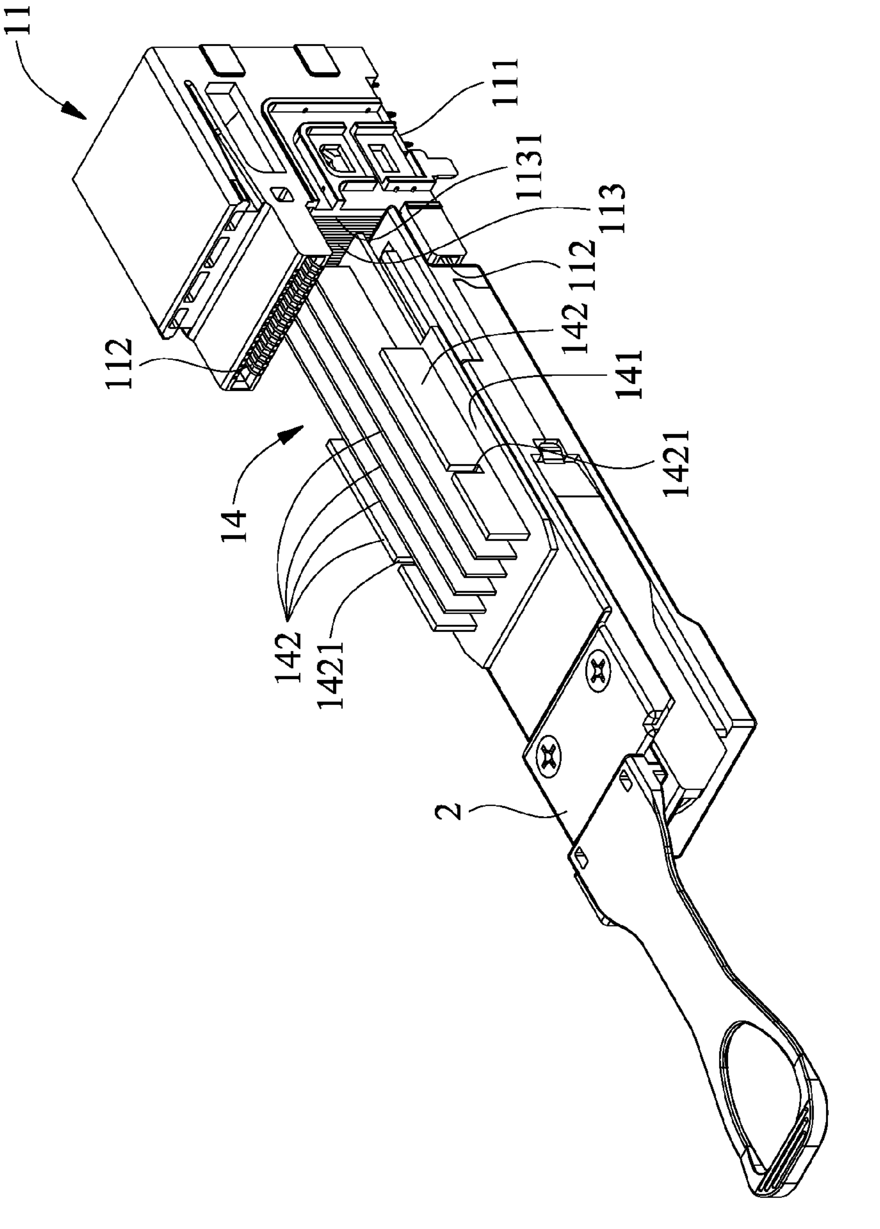
FIG. 13 is an assembled perspective view of a heat-dissipation element, a base and a plug device included in the connector module according to the second embodiment of the present invention.
Figure 14:
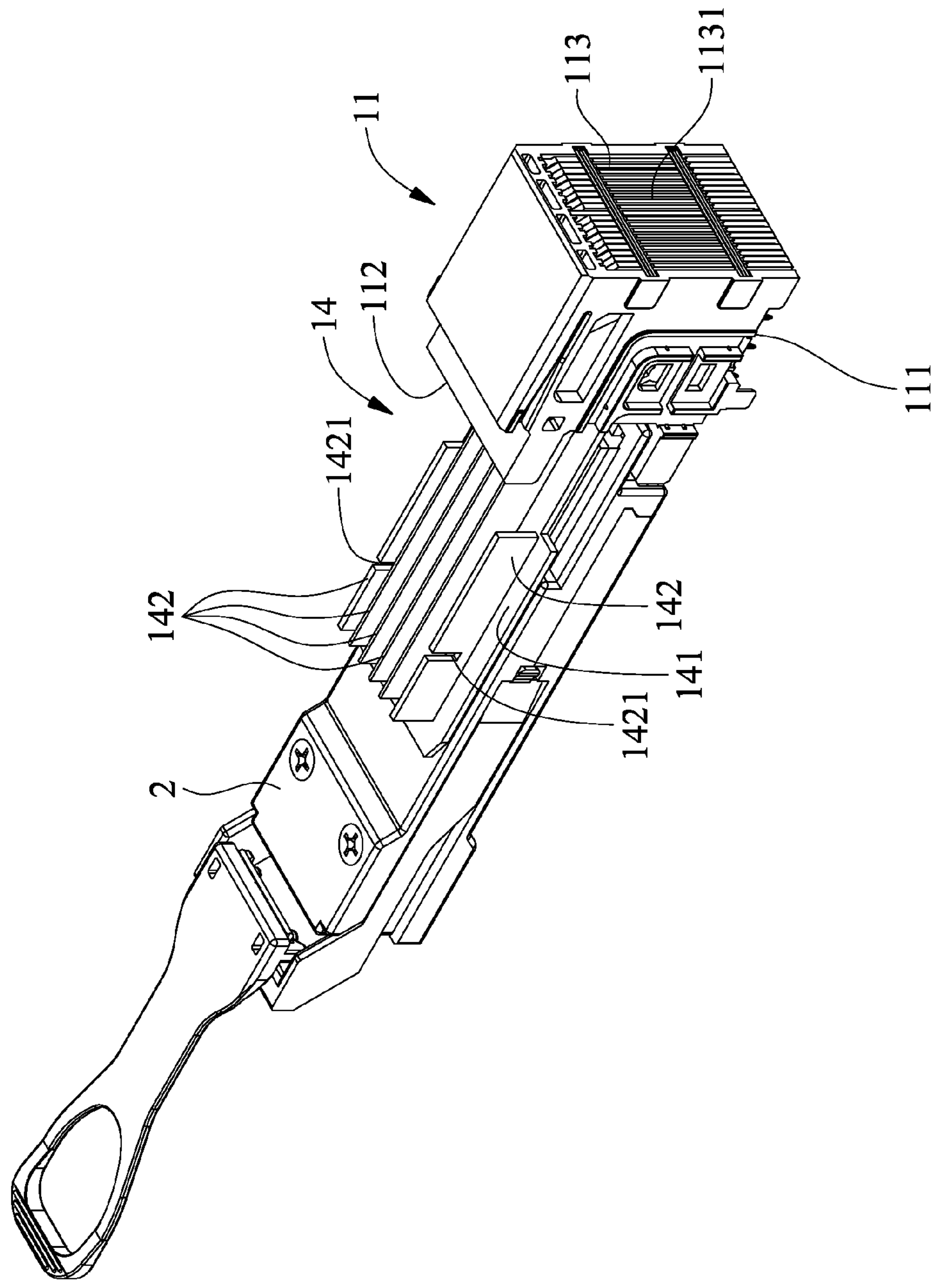
FIG. 14 is a rear view of FIG. 13.
Figure 15:
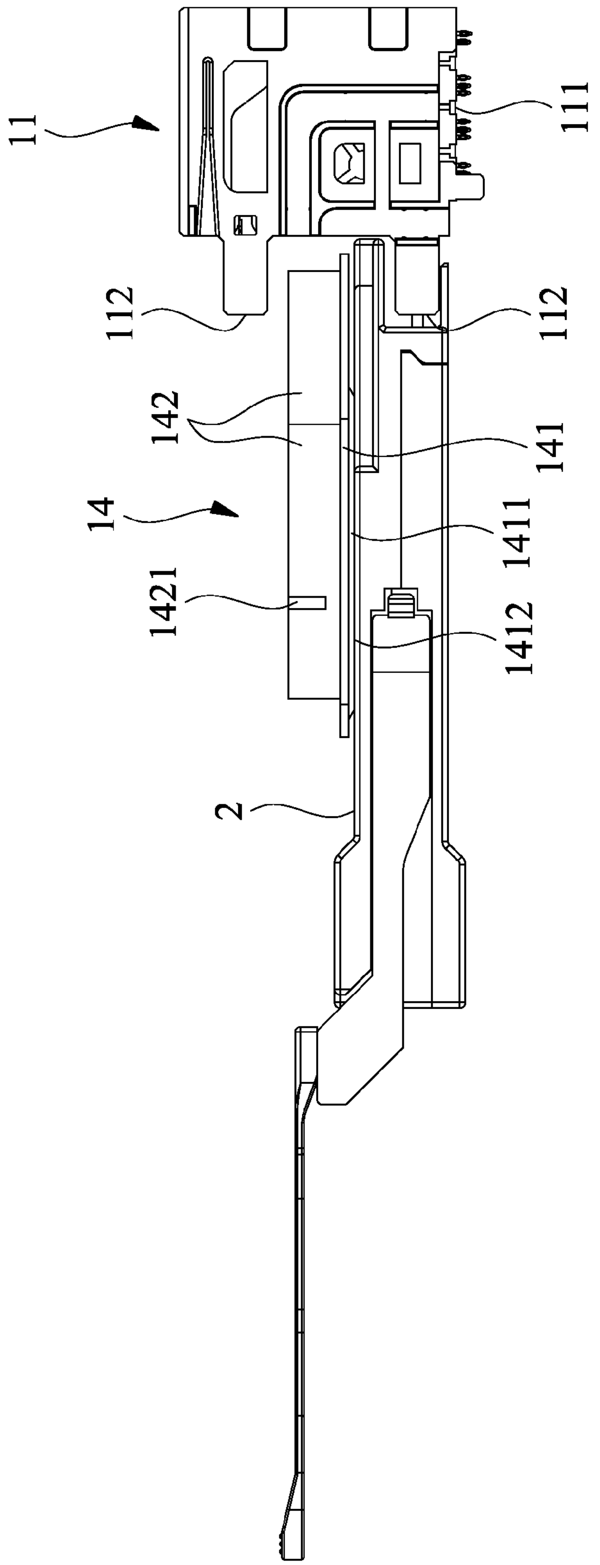
FIG. 15 is a side view of FIG. 13.

FIG. 8 is an exploded perspective view and FIGS. 9 and 10 are assembled front and rear perspective views, respectively, of a connector module according to a second embodiment of the present invention. The second embodiment is generally structurally similar to the first embodiment but has a heat-dissipation element 14 different from the heat-dissipation element 13. Please also refer to FIGS. 11 to 15, wherein FIG. 11 is a perspective view showing the heat-dissipation element 14, the base 11 and the supporting rack 122 in an assembled state; FIG. 12 is a perspective view showing the heat-dissipation element 14, the base 11 and two sets of light-guide bars 114 in an assembled state; FIGS. 13 and 14 are front and rear perspective views, respectively, showing the heat-dissipation element 14, the base 11 and the lower plug device 2 in an assembled state; and FIG. 15 is a side view of FIG. 13. As in the first embodiment, the connector module main body 1 in the second embodiment also requires at least one heat-dissipation passage 1131 formed between the two top-and-bottom spaced slots 112 on the base 11, and at least one heat outlet 123 formed on a rear portion of the case 12. The heat-dissipation element 14 includes a heat-absorption unit 141 having a bottom providing a heat-absorbing surface 1412, and at least one heat-dissipation unit 142 located on a top of the heat-absorption unit 141 and provided with a fixing notch 1421 each. The heat-dissipation element 14 is disposed in the lying U-shaped supporting rack 122 with a front end abutted against at least one stopper 1223 internally provided on the bottom of the supporting rack 122, such that the heat-absorbing surface 1412 is located corresponding to the bottom opening 1221 of the supporting rack 122 and the fixing notch 1421 on the heat-dissipation unit 142 is detachably engaged with a V-shaped locating spring 1222 correspondingly provided on a top of the supporting rack 122. Each of the light-guide bars 114 on the base 11 can also be set between two adjacent heat-dissipation units 142 to enable increased mounting stability of the heat-dissipation element 14 in the supporting rack 122. In the second embodiment of the present invention, since the heat-absorbing surface 1412 of the heat-absorption unit 141 of the heat-dissipation element 14 is in direct contact with the top outer surface of the lower plug device 2, and since the heat-dissipation element 14 is in direct contact with the supporting rack 122 of the connector module main body 1, the waste heat produced by the connector module main body 1 and the lower plug device 2 can be absorbed by the heat-absorption unit 141 and then transferred to the heat-dissipation unit 142. By convection, the waste heat transferred to the heat-dissipation unit 142 passes through the heat-dissipation passages 1131 and the heat outlet 123 to dissipate into ambient air. With these arrangements, the connector module main body 1 and the plug devices 2 can have increased heat-dissipation efficiency and data transmission rate. Again, in the second embodiment, the base 11 requires at least one heat-dissipation passage 1131 and the case 12 requires at least one heat outlet 123 to enable dissipation of the waste heat into ambient air by convection. The connector module main body 1 in the second embodiment can ensure even better heat transfer and heat convection effects when it has a plurality of heat-dissipation passages 1131 and a plurality of heat outlets 123.

As can be seen in FIG. 8, the heat-absorption unit 141 can be a heat-absorbing sheet and the heat-dissipation unit 142 can be a radiation fin. In the embodiment shown in FIG. 8, the heat-dissipation unit 142 can be welded or glued to the top of the heat-absorption unit 141. In a third embodiment of the present invention as shown in FIG. 16, the heat-absorption unit 141 and the heat-dissipation unit 142 can be integrally formed by cutting and bending a substantially T-shaped flat sheet.

Figure 16:
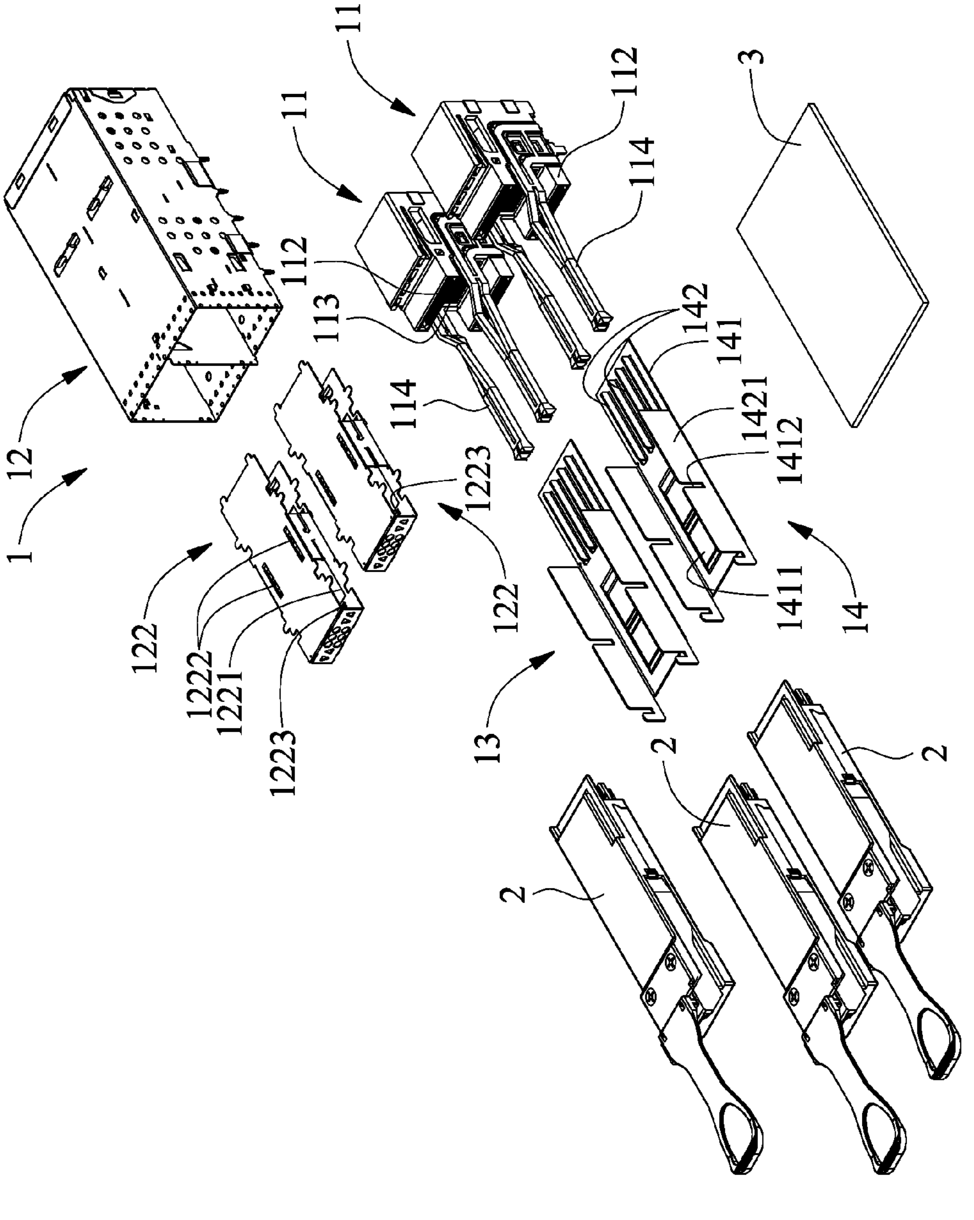
FIG. 16 is an exploded perspective view of a connector module according to a third embodiment of the present invention.

Please refer to FIGS. 15 and 16. In the second and the third embodiment, the heat-absorption unit 141 can be stamped or be cut and bent to form at least one downward protruded portion 1411. In this case, the heat-absorbing surface 1412 is located on the at least one protruded portion 1411. When the lower plug device 2 passes through the lower slot way 121, the heat-absorbing surface 1412 on the at least one protruded portion 1411 is in direct contact with part of the top outer surface of the lower plug device 2 to absorb the waste heat produced by the lower plug device 2.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A connector module, comprising:

a connector module main body including a base and a case; the base having an external connection surface formed at a bottom thereof and two top-and-bottom spaced slots located above the external connection surface; the case having a front portion internally formed into an upper and a lower slot way, which are separated from each other by a supporting rack mounted in the case between the two slot ways, and the supporting rack having a bottom opening; and the base being fitted in the case such that the external connection surface is downward exposed from the case and the two slots are located corresponding to and communicable with the upper and lower slot ways; and a heat-dissipation element having a heat-absorbing surface and being mounted in the connector module main body in a front-rear direction, such that the heat-absorbing surface is located corresponding to the bottom opening of the supporting rack and above a top inner wall surface of the lower slot way in the case for directly contacting with a plug device that is plugged in the lower slot way.

2. The connector module as claimed in claim 1, wherein the heat-dissipation element includes three sequentially arranged sections, namely, a heat-absorption section, a heat-transfer section and a heat-dissipation section; the heat-absorbing surface being located on a bottom of the heat-absorption section; and the heat-transfer section being extended through a space between the two top-and-bottom spaced slots of the base and through the case, such that the heat-dissipation section is exposed from the case.

3. The connector module as claimed in claim 2, wherein the heat-absorption section is U-shaped, the heat-transfer section and the heat-dissipation section are respectively flat in shape, and the heat-transfer section is extended from one lateral side of the heat-absorption section and is sidewardly bent behind the base to form the heat-dissipation section.

4. The connector module as claimed in claim 2, wherein the heat-absorption section is formed with at least one downward protruded portion, and the heat-absorbing surface being located on the protruded portion.

5. The connector module as claimed in claim 2, wherein the heat-dissipation element further includes at least one radiation fin, which can be selectively provided on one or both of a top of the heat-absorption section and the heat-dissipation section; and the heat-dissipation section can optionally have at least one graphite fin provided thereon.

6. The connector module as claimed in claim 1, wherein the base further includes at least one heat-dissipation passage formed between the two top-and-bottom spaced slots, and the case has a rear portion formed with at least one heat outlet; and wherein the heat-dissipation element includes a heat-absorption unit and a heat-dissipation unit located atop the heat-absorption unit; the heat-absorbing surface being located on a bottom of the heat-absorption unit; and both of the heat-absorption unit and the heat-dissipation unit being located in the supporting rack.

7. The connector module as claimed in claim 6, wherein the heat-absorption unit is a heat-absorbing sheet and the heat-dissipation unit is a radiation fin.

8. The connector module as claimed in claim 6, wherein the heat-absorption unit is formed with at least one downward protruded portion, and the heat-absorbing surface being located on the protruded portion.

* * * * *